(12) United States Patent
Miura et al.

(10) Patent No.: US 10,347,577 B2
(45) Date of Patent: *Jul. 9, 2019

(54) WIRING WITH EXTERNAL TERMINAL

(71) Applicant: Micron Technology, Inc., Boise, ID (US)

(72) Inventors: Yuki Miura, Sagamihara (JP); Mieko Kojima, Hino (JP)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/973,046

(22) Filed: May 7, 2018

(65) Prior Publication Data

US 2018/0254245 A1 Sep. 6, 2018

Related U.S. Application Data

(63) Continuation of application No. 15/344,211, filed on Nov. 4, 2016, now Pat. No. 10,020,252.

(51) Int. Cl.
*G11C 5/06* (2006.01)
*H01L 23/522* (2006.01)
*G11C 7/22* (2006.01)
*G11C 29/02* (2006.01)

(52) U.S. Cl.
CPC .......... *H01L 23/5226* (2013.01); *G11C 5/06* (2013.01); *G11C 5/063* (2013.01); *G11C 7/22* (2013.01); *G11C 29/022* (2013.01); *G11C 29/028* (2013.01)

(58) Field of Classification Search
CPC ....... G11C 5/063; G11C 7/18; G11C 11/4097; G11C 11/04; G11C 11/12
USPC ...................................................... 365/51, 63
See application file for complete search history.

(56) References Cited

U.S. PATENT DOCUMENTS

| 5,594,371 | A  | 1/1997  | Douseki        |
| 6,278,148 | B1 | 8/2001  | Watanabe et al.|
| 6,292,015 | B1 | 9/2001  | Ooishi et al.  |
| 6,310,487 | B1 | 10/2001 | Yokomizo       |

(Continued)

FOREIGN PATENT DOCUMENTS

| JP | 11031385 A    | 2/1999 |
| WO | 2019028074 A1 | 2/2019 |
| WO | 2019036257 A1 | 2/2019 |

OTHER PUBLICATIONS

U.S. Appl. No. 15/709,250, entitled "Power Supply Wiring in a Semiconductor Memory Device", filed Sep. 19, 2017.

(Continued)

*Primary Examiner* — Son T Dinh

(74) *Attorney, Agent, or Firm* — Dorsey & Whitney LLP

(57) ABSTRACT

Apparatuses for providing external terminals of a semiconductor device are described. An example apparatus includes: a pad formation area including a plurality of pads disposed at an edge of the apparatus; a peripheral circuit area including a plurality of circuit blocks coupled to a memory cell array, each circuit block of the plurality of circuit blocks including a via disposed at a side opposite to the pad formation area with respect to each circuit block; and a plurality of conductors, each conductor coupling the via to the corresponding pad, and crossing over, at least in part, an area in the peripheral circuit area that is outside the circuit block comprising the via.

20 Claims, 9 Drawing Sheets

(56) References Cited

U.S. PATENT DOCUMENTS

| | | |
|---|---|---|
| 8,269,348 B2 | 9/2012 | Fazelpour |
| 10,020,252 B2 * | 7/2018 | Miura ................. G11C 5/06 |
| 10,141,932 B1 | 11/2018 | Sato |
| 2003/0038653 A1 | 2/2003 | Ooishi et al. |
| 2004/0047229 A1 | 3/2004 | Fujisawa et al. |
| 2004/0217776 A1 | 11/2004 | Horiguchi et al. |
| 2006/0227587 A1 | 10/2006 | Nakamura et al. |
| 2006/0267219 A1 * | 11/2006 | Nakamura ........ H01L 23/49838 257/784 |
| 2007/0045828 A1 | 3/2007 | Kwon et al. |
| 2008/0220607 A1 | 9/2008 | Hummler |
| 2009/0290271 A1 | 11/2009 | Yang et al. |
| 2010/0214812 A1 | 8/2010 | Kim |
| 2010/0230780 A1 | 9/2010 | Obayashi |
| 2010/0301466 A1 | 12/2010 | Taoka et al. |
| 2011/0254617 A1 | 10/2011 | Ishii et al. |
| 2013/0285247 A1 | 10/2013 | Minda et al. |
| 2014/0003113 A1 | 1/2014 | Seno et al. |
| 2014/0063887 A1 | 3/2014 | Vogelsang |
| 2015/0035054 A1 | 2/2015 | Nishizaki |
| 2015/0108637 A1 | 4/2015 | Usami et al. |
| 2015/0221714 A1 | 8/2015 | Gu et al. |
| 2015/0302900 A1 | 10/2015 | Lee et al. |
| 2017/0110160 A1 | 4/2017 | Seo et al. |
| 2017/0110161 A1 | 4/2017 | Seo |
| 2019/0057726 A1 | 2/2019 | Nishizaki |
| 2019/0074834 A1 | 3/2019 | Sato |

OTHER PUBLICATIONS

U.S. Appl. No. 15/344,211, entitled "Wiring With External Terminal", filed Nov. 4, 2016.
International Search Report and Written Opinion received in PCT Application No. PCT/US2017/046803, dated Nov. 23, 2017.
"RDL—Bond Pad Redistribution Layers", obtained at: http://www.yieldengineering.com/portals/0/yes-rdl_explanation.pdf on Nov. 4, 2016.
U.S. Appl. No. 15/669,801, entitled, "Wiring With External Terminal", filed Aug. 4, 2017.
PCT Application No. PCT/US2018/044695 titled "Wiring With External Terminal" filed on Jul. 31, 2018.
PCT Application No. PCT/US2018/045813 titled "Power Supply Wiring in a Semiconductor Memory Device" filed Aug. 8, 2018.
U.S. Appl. No. 16/183,615 titled "Wiring With External Terminal" filed Nov. 7, 2018, pp. all.
U.S. Appl. No. 16/380,912 titled "Power Supply Wiring in a Semiconductor Memory Device" filed Apr. 10, 2019; pp. all.

* cited by examiner

WIRING WITH EXTERNAL TERMINAL

CROSS-REFERENCE TO RELATED APPLICATION

This application is a continuation of U.S. patent application Ser. No. 15/344,211 filed Nov. 4, 2016 and issued as U.S. Pat. No. 10,020,252 on Jul. 10, 2018. The aforementioned application, and issued patent, is incorporated herein by reference, in its entirety, for any purpose.

BACKGROUND

High data reliability, high speed of memory access, reduced chip size and reduced power consumption are features that are demanded from semiconductor memory.

In conventional peripheral circuitries for a semiconductor device, for example, pads and data queue circuits (or data input/output circuits) are arranged in a corresponding manner across layers. The data queue circuit or data input/output circuit is called collectively "DQ circuit" hereinafter. FIG. 1 is a schematic diagram of peripheral circuitries around external terminals in a semiconductor device. Each pad, which is configured to be coupled to an external circuitry outside the semiconductor device, is located in proximity to (e.g., immediately above) its respective DQ circuit in order to keep wirings between the pads and the DQ circuits the same length that is sufficiently short to have the same low impedance. In recent years, there has been an effort to reduce an area of a peripheral circuit region that is occupied by peripheral circuitries included on a semiconductor die of a memory device. For example, a size of each DQ circuit has become even smaller in order to improve driving ability for faster operations by shorter wirings (e.g., a clock signal line CLK, which provides a clock signal to the DQ circuits).

DETAILED DESCRIPTION OF PREFERRED EMBODIMENTS

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

As previously described, a size of each DQ circuit has become even smaller; however, reducing a size of each pad is still challenging. Due to the size difference between pads and DQ circuits, wirings between the DQ circuits as well as between the DQ circuits and the pads are longer. The longer wirings tend to result in higher power consumption due to each wiring's inherent impedance according to its length.

Figure 1:
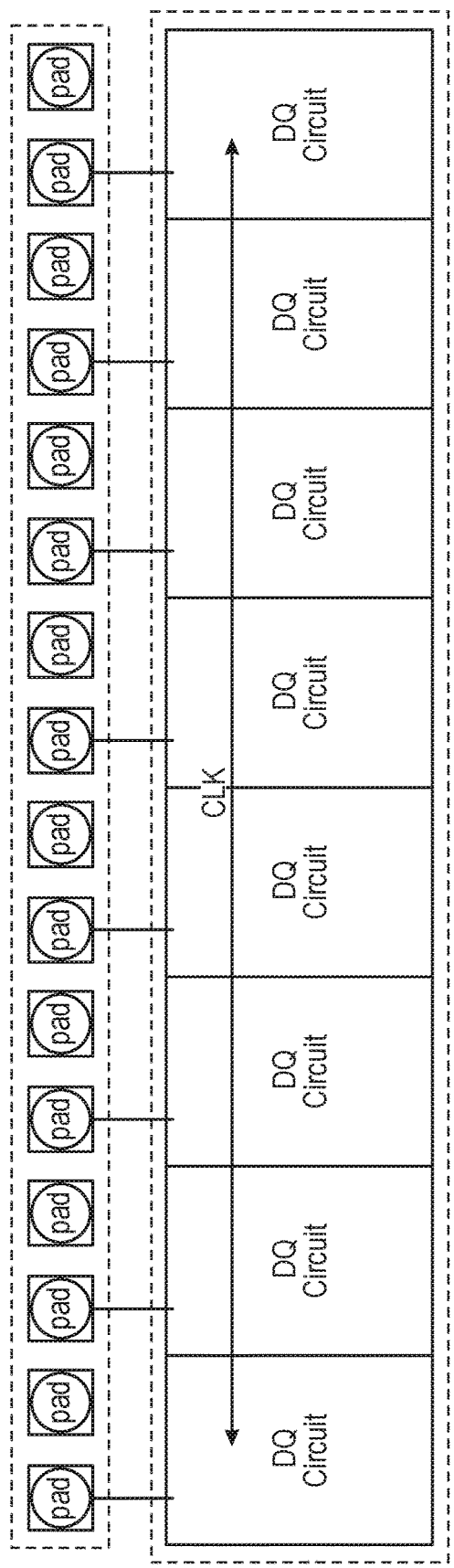
FIG. 1 is a schematic diagram of prior art peripheral circuitries around external terminals in a semiconductor device.
Figure 2:
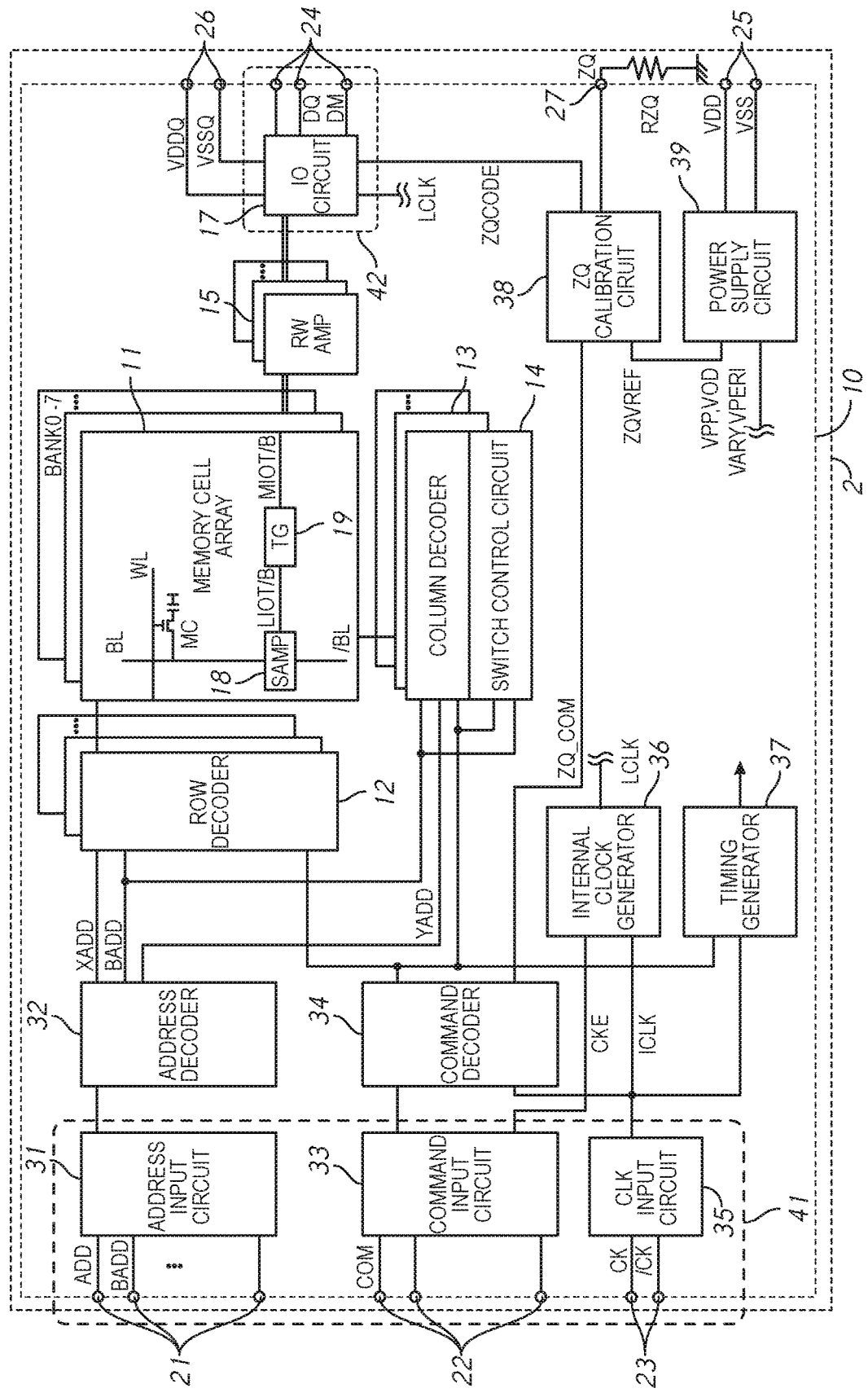
FIG. 2 is a block diagram of a semiconductor device in accordance with the present disclosure.

FIG. 2 is a block diagram of a semiconductor device 10 in accordance with one embodiment of the present disclosure. The semiconductor device 10 may be a DDR4 SDRAM integrated into a single semiconductor chip, for example. The semiconductor device 10 may be mounted on an external substrate 2 that is a memory module substrate, a mother board or the like. The external substrate 2 employs an external resistor $R_{ZQ}$ that is connected to a calibration terminal ZQ 27 of the semiconductor device 10. The external resistor $R_{ZQ}$ is a reference impedance of a ZQ calibration circuit 38. In the present embodiment, the external resistor $R_{ZQ}$ is coupled to a ground potential.

As shown in FIG. 2, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers 18 are coupled to corresponding bit lines BL and connected to local UQ line pairs LIOT/B. Local IO line pairs LIOT/B are connected to main IO line pairs MIOT/B via transfer gates TG 19 which function as switches.

Turning to the explanation of a plurality of external terminals included in the semiconductor device 10, the plurality of external terminals includes address terminals 21, command terminals 22, clock terminals 23, data terminals 24, power supply terminals 25 and 26, and the calibration terminal ZQ 27. An input signal block 41 may include the address terminals 21, the command terminals 22 and the clock terminals 23 may include input buffers that will be later described, according to one embodiment. A data interface block 42 includes the data terminals 24. The data terminals 24 may be coupled to output buffers for read operations of memories. Alternatively, the data terminals 24 may be coupled to input buffers for read/write access of the memories. FIG. 2 shows an example of dynamic random access memory (DRAM), however, any device having external terminals for signal input/output may be included as the external terminals of embodiments of the present disclosure.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12, the column decoder 13, and a switch control circuit 14.

The command terminals 22 are supplied with a command signal COM. The command signal COM may include one or more separate signals. The command signal COM input to the command terminals 21 is input to a command decoder 34 via the command input circuit 33. The command decoder 34 decodes the command signal COM to generate various internal command signals. For example, the internal commands may include a row command signal to select a word line and a column command signal, such as a read command or a write command, to select a bit line, and a calibration signal ZQC provided to the ZQ calibration circuit 38.

Accordingly, when a read command is issued and a row address and a column address are timely supplied with the read command, read data is read from a memory cell MC in the memory cell array 11 designated by these row address and column address. The read data DQ is output externally from the data terminals 24 via a read/write amplifier 15 and an input/output circuit 17. Similarly, when the write command is issued and a row address and a column address are timely supplied with this command, and then write data DQ is supplied to the data terminals 24, the write data DQ is supplied via the input/output circuit 17 and the read/write amplifier 15 to the memory cell array 11 and written in the memory cell MC designated by the row address and the column address.

The clock terminals 23 are supplied with external clock signals CK and /CK, respectively. These external clock signals CK and /CK are complementary to each other and are supplied to a clock input circuit 35. The clock input circuit 35 receives the external clock signals CK and /CK and generates an internal clock signal ICLK. The internal clock signal ICLK is supplied to an internal clock generator 36 and thus a phase controlled internal clock signal LCLK is generated based on the received internal clock signal ICLK and a clock enable signal CKE from the command input circuit 33. Although not limited thereto, a DLL circuit can be used as the internal clock generator 36. The phase controlled internal clock signal LCLK is supplied to the input/output circuit 17 and is used as a timing signal for determining an output timing of the read data DQ. The internal clock signal ICLK is also supplied to a timing generator 37 and thus various internal clock signals can be generated.

The power supply terminals 25 are supplied with power supply potentials VDD and VSS. These power supply potentials VDD and VSS are supplied to an internal power supply circuit 39. The internal power supply circuit 39 generates various internal potentials VPP, VOD, VARY, VPERI, and the like and a reference potential ZQVREF based on the power supply potentials VDD and VSS. The internal potential VPP is mainly used in the row decoder 12, the internal potentials VOD and VARY are mainly used in the sense amplifiers 18 included in the memory cell array 11, and the internal potential VPERI is used in many other circuit blocks. The reference potential ZQVREF is used in the ZQ calibration circuit 38.

The power supply terminals 26 are supplied with power supply potentials VDDQ and VSSQ. These power supply potentials VDDQ and VSSQ are supplied to the input/output circuit 17. The power supply potentials VDDQ and VSSQ may be the same potentials as the power supply potentials VDD and VSS that are supplied to the power supply terminals 25, respectively. However, the power supply potentials VDDQ and VSSQ may be used for the input/output circuit 17 so that power supply noise generated by the input/output circuit 17 does not propagate to the other circuit blocks.

The calibration terminal ZQ is connected to the calibration circuit 38. The calibration circuit 38 performs a calibration operation with reference to an impedance of an external resistance Re and the reference potential ZQVREF, when activated by the calibration signal ZQ_COM. An impedance code ZQCODE obtained by the calibration operation is supplied to the input/output circuit 17, and thus an impedance of an output buffer (not shown) included in the input/output circuit 17 is specified.

Figure 3:
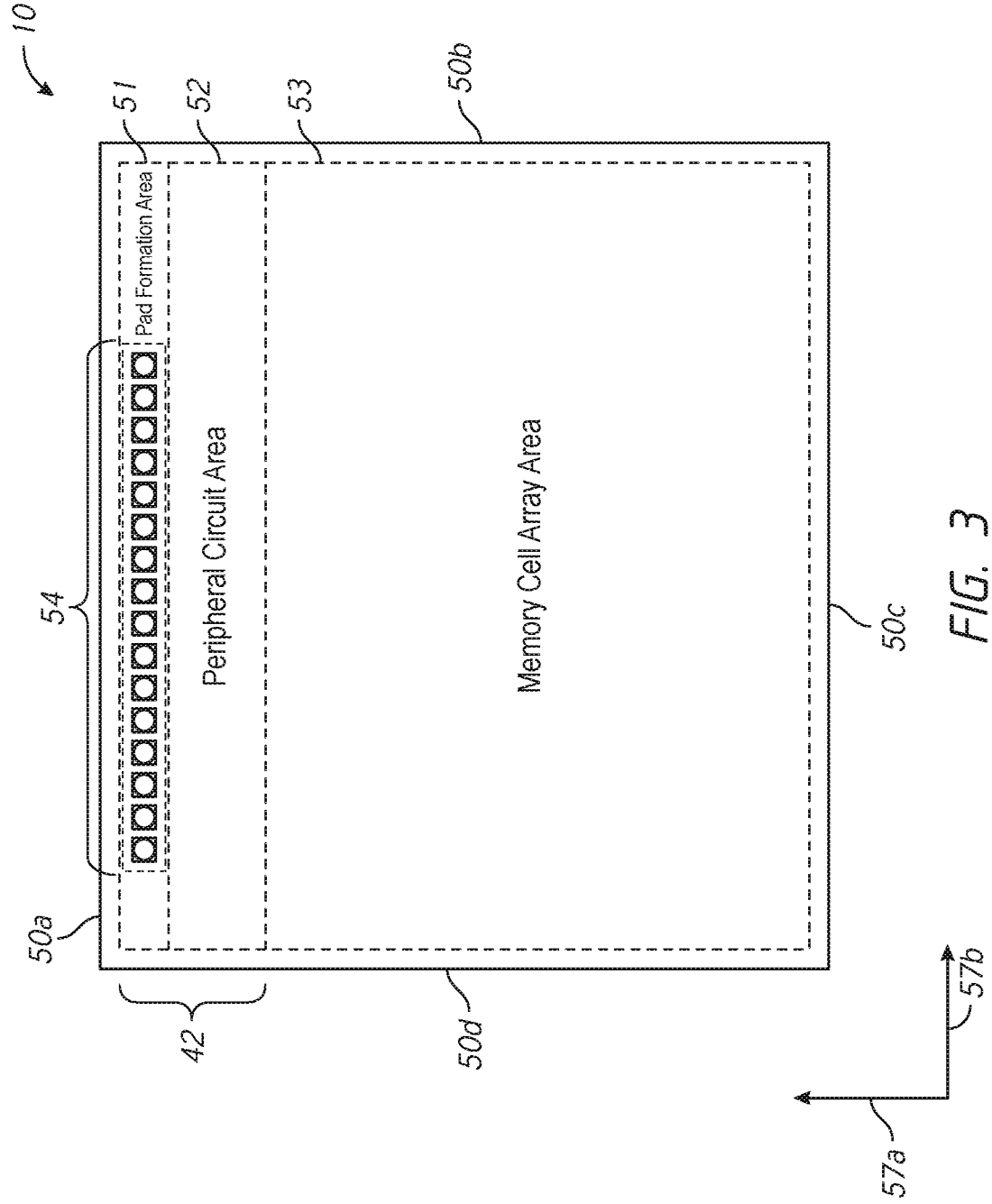
FIG. 3 is a layout diagram of the semiconductor device in accordance with one embodiment of the present disclosure.

FIG. 3 is a layout diagram of the semiconductor device 10 in accordance with one embodiment of the present disclosure. The semiconductor device 10 may have edges 50a, 50b, 50c and 50d, which define ends of the semiconductor device 10. The edges 50b and 50d may be extending along a first direction 57a and the edges 50a and 50c may be extending along a second direction 57b that is substantially perpendicular to the first direction 57a. For example, FIG. 3 may be a plan view of a layout of the semiconductor device 10, including circuits and array areas, from a third direction (not shown) that is perpendicular to the first and second directions, 57a and 57b. The semiconductor device 10 may include a pad formation area 51, a peripheral circuit area 52 and a memory cell array area 53 aligned in the first direction 57a in this order. The data interface block 42 in FIG. 2 may be disposed across the pad formation area 51 along the edge 50a. The peripheral circuit area 52 may be disposed between the pad formation area 51 and the memory cell array area 53. The pad formation area 51 may include a plurality of pads 54 disposed along the edge 50a. For example, the plurality of pads 54 may include external terminals 24 and power supply terminals 26 in FIG. 2. The memory cell array area 53 may include, for example, memory cell array 11 in FIG. 2.

Figure 4:
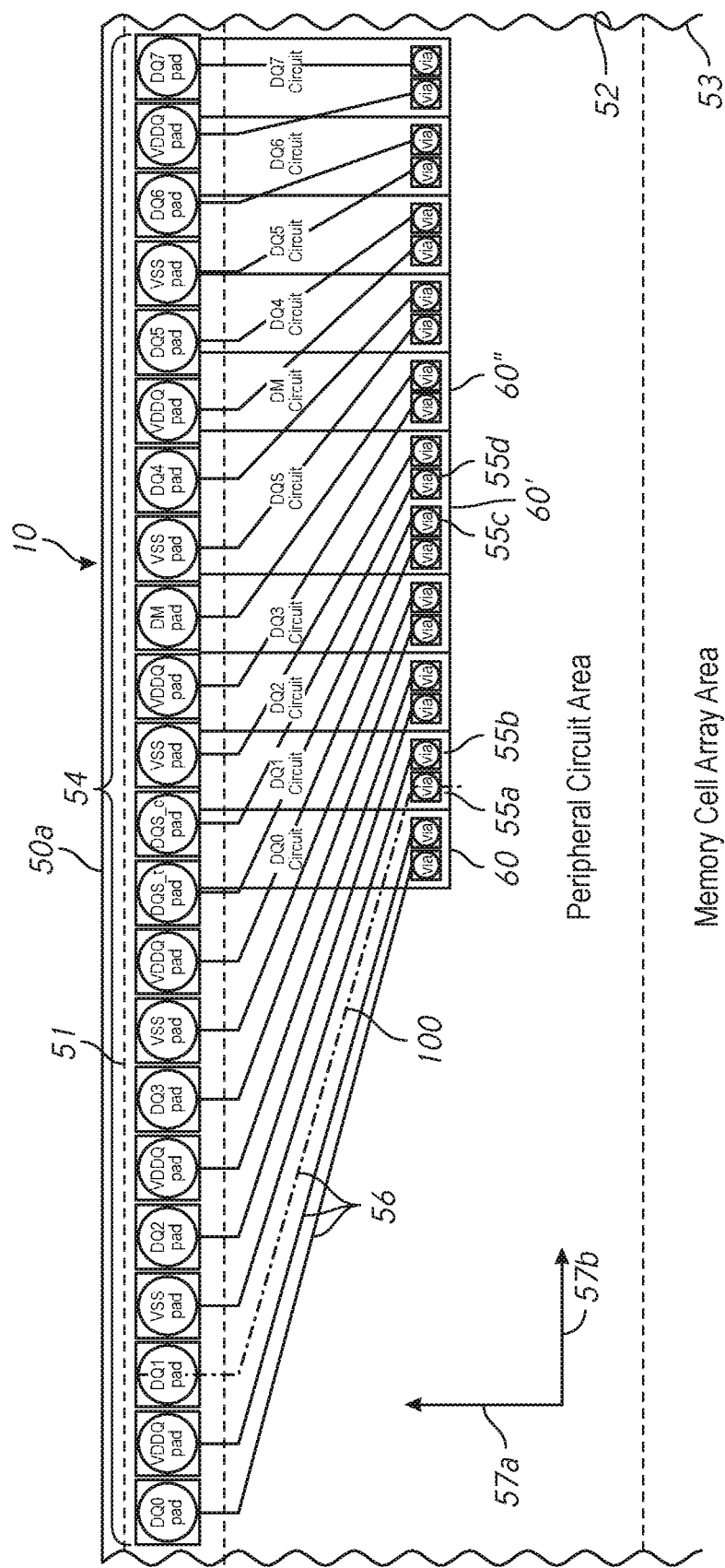
FIG. 4 is a schematic diagram of circuits around external terminals in the semiconductor device in accordance with the present disclosure.

FIG. 4 is a schematic diagram of circuits around external terminals in the semiconductor device 10 in accordance with one embodiment of the present disclosure. For example, FIG. 4 may be a plan view of circuits around external terminals in the semiconductor 10 from the third direction (not shown). The semiconductor device 10 may include the pad formation area 51, the peripheral circuit area 52 and the memory cell array area 53 in a first direction 57a. The plurality of pads 54 on the pad formation area 51 may be disposed along the edge 50a that extends in a second direction 57b, which is substantially perpendicular to the first direction 57a. The plurality of pads 54 may include DQ0 to DQ7 pads for data queues (DQ0 to DQ7) for reading or writing 8-bit data, a plurality of VDDQ pads for receiving a first power voltage (VDD), a plurality of VSS pads for receiving a second power voltage (VSS, e.g., a ground voltage), a DQS_t pad and a DQS_c pad for receiving true and complementary data strobe signals (DQS_t and DQS_c) and a DM pad for receiving data mask (DM) signals. A plurality of circuit blocks, including data queue (DQ) circuits 60 for data queues (DQ0 to DQ7) for reading or writing 8-bit data, a data strobe (DQS) circuit 60' and a data mask (DM) circuit 60", aligned in the second direction 57*b*, may be disposed across the pad formation area 51 and the peripheral circuit area 52. A total width of the plurality of pads 54 along the edge 50*a* in the second direction 57*b* may be substantially large than a total width of the plurality of DQ circuits 60, 60' and 60" along the edge 50*a* in the second direction 57*b*. Each DQ circuit 60 of the plurality of DQ circuits may include a plurality of vias disposed along a first side of each DQ circuit 60 that is opposite to a second side of each DQ circuit 60. The pad formation area 51 extends along the second sides of the plurality of DQ circuits 60, 60' and 60". For example, each via of the plurality of vias may be coupled to a corresponding pad of the plurality of corresponding pads 54 by a corresponding wiring 56. For example, wirings 56 may be conductors made of a distribution conductive layer (e.g., an inline redistribution layer [iRDL]). For example, a DQ1 circuit 60 for DQ1 may include a via 55*a* and a via 55*b*. The via 55*a* may be coupled to the pad 54 for DQ1 (DQ1 pad) and the via 55*b* may be coupled to the pad 54 for VSS (VSS pad). A cross section 100 may be defined by a line between the DQ1 pad 54 and the via 55*a*, and a width of the line extending in the third direction that is perpendicular to the first direction 57*a* and the second direction 57*b*. The cross section 100 may be referred later in this disclosure. Each wiring 56 may cross over an area outside of the corresponding circuit block. For example, a wiring 56 which coupled the DQ1 pad 54 and the via 55*a* may cross over a DQ0 circuit 60 for DQ1 and an area outside the circuit blocks. For example, a DQ5 pad 54 may be disposed in an area above and across a DQ4 circuit 60 for DQ4 that is an adjacent circuit block to the DQ5 circuit 60, and the DM circuit 60" that is an adjacent circuit block to the DQ4 circuit 60. Thus, a wiring 56 coupling the DQ5 pad and a via 55 for DQ5 in a DQ5 circuit 60 may cross over the adjacent DQ4 circuit 60. A DQ6 pad 54 may be disposed in an area above the DQ5 circuit 60 and a wiring 56 coupling the DQ6 pad 54 and the DQ6 circuit 60 may cross over the DQ6 circuit 60 and at least in part of the adjacent DQ5 circuit 60.

Figure 5A:
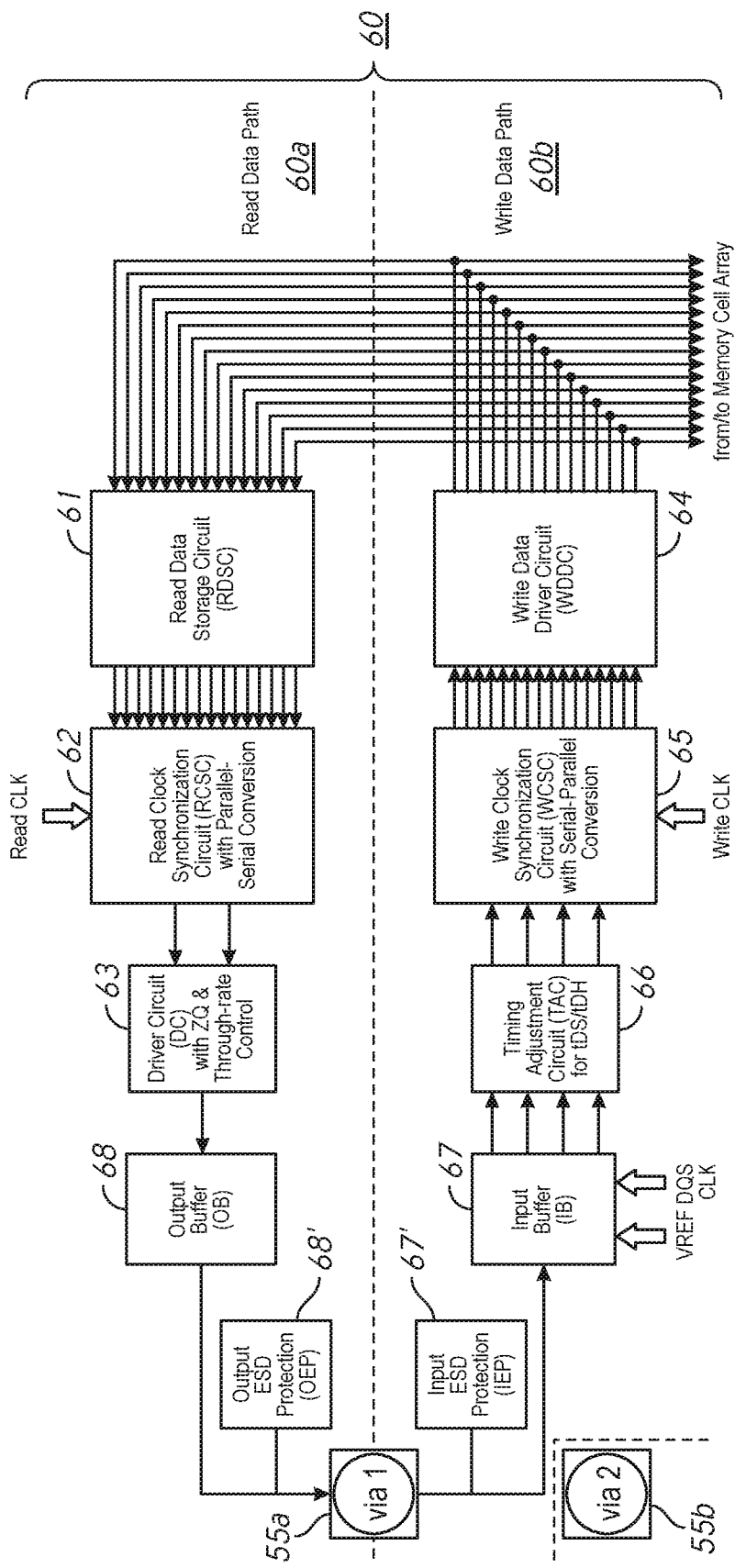
FIG. 5A is a block diagram of a DQ circuit in the semiconductor device in accordance with the present disclosure.

FIG. 5A is a block diagram of a DQ circuit 60 in the semiconductor device 10 in accordance with the present disclosure. For example, the DQ circuit 60 may execute read operations of data from a plurality of memory cells in the memory cell array area 53 to a via 1 55*a* via a read data path 60*a*. The DQ circuit 60 may execute write operations of data from the via 1 55*a* to a plurality of memory cells in the memory cell array area 53 via a write data path 60*b*. A via 2 55*b* may be located next to the via 1 55*a*, however, the via 2 55*b* may be coupled to either a VDDQ pad or a VSS pad for receiving a power voltage, and thus outside of the DQ circuit 60.

For example, the read data path 60*a* may include a read data storage circuit (RDSC) 61, a read clock synchronization circuit (RCSC) 62, a driver circuit (DC) 63, an output buffer (OB) 68 and an output ESD (electrostatic discharge) protection circuit (OEP) 68'. A read data storage circuit (RDSC) 61 may receive data read from a plurality of memory cells in the memory cell array area 53 and store the data. For example, the read clock synchronization circuit (RCSC) 62 may receive a clock signal for reading operations (Read CLK) and the data from the read data storage circuit (RDSC) 61. The read clock synchronization circuit (RCSC) 62 may convert the data in a plurality of bits in parallel into the data in time sequence (in a serial format), and provide the data in time sequence using the Read CLK signal. The driver circuit (DC) 63 may adjust a through rate of the output buffer (OB) 68, based on, at least in part, the calibration signal ZQ (e.g., via the calibration terminal ZQ 27 in FIG. 2). The output buffer (OB) 68 may provide the data in serial format to the via 1 55*a*. The output ESD protection circuit (OEP) 68' may protect the data transmitted from the output buffer (OB) 68 to the via 1 55*a* from failures due to electrostatic charges.

For example, the write data path 60*b* may include a write data driver circuit (WDDC) 64, a write clock synchronization circuit (WCSC) 62, a timing adjustment circuit (TAC) 66, an input buffer (TB) 67 and an input ESD protection circuit (IEP) 67', The input ESD protection circuit (IEP) 67' may protect data transmitted from the via 1 55*a* to the input buffer (IB) 67 from failures due to electrostatic charges. The input buffer (IB) 67 may receive the data from the via 1 55*a*, a reference voltage REF and a data strobe clock signal (DQS CLK). Responsive to the data strobe clock signal (DQS CLK), the input buffer (IB) 67 may latches the data from the via 1 55*a* using a reference voltage (VREF) to determine a value of the data (e.g., a logic high level or a logic low level). The time adjustment circuit (TAC) 66 may adjust a timing to provide the data from the input buffer (IB) 67 to a later stage of the write data path 60*b*, in view of a data setup time tDS and a data hold time tDH. For example, the data setup time tDS may describe a setup time of an input data pin at the pad 54 for both rising and falling edges of the data strobe signal DQS. The data hold time tDH may describe a hold time of an input data pin at the pad 54 for both rising and falling edges of the data strobe signal DQS. For example, the write clock synchronization circuit (WCSC) 65 may receive a clock signal for writing operations (Write CLK) and the data from the time adjustment circuit (TAC) 66. The write clock synchronization circuit (WCSC) 65 may convert, the data in the serial format into the data in a plurality of bits in parallel, and provide the data in the plurality of bits in parallel to the write data driver circuit (WDDC) 64 responsive to the Write CLK signal. The write data driver circuit (WDDC) 64 may include a plurality of driver that may provide the data in parallel to the memory cells in the memory cell array area 53.

Figure 5B:
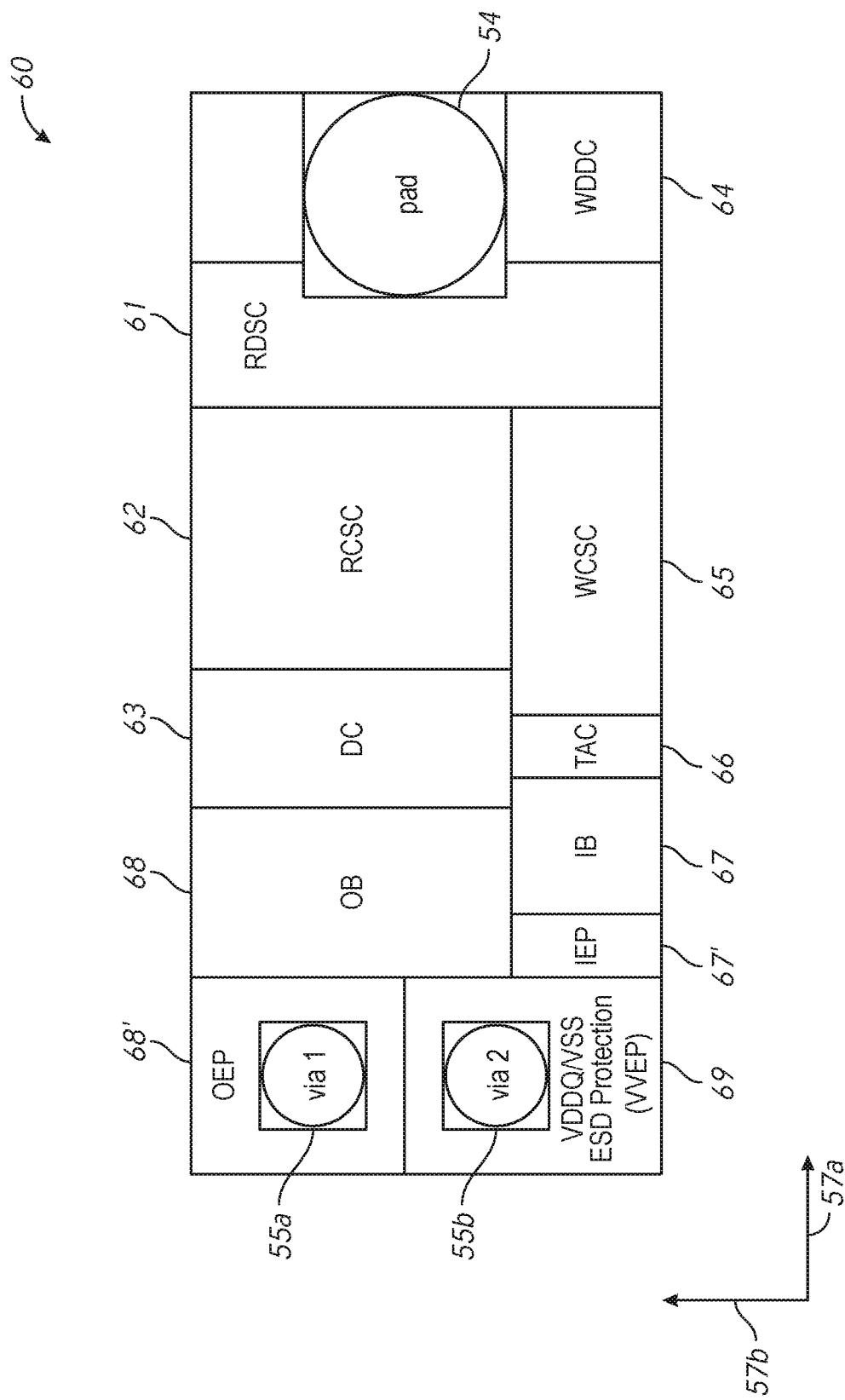
FIG. 5B is a layout diagram including a DQ circuit and a pad in the semiconductor device in accordance with one embodiment of the present disclosure.

FIG. 5B is a layout diagram including a DQ circuit 60 and a pad 54 in the semiconductor device 10 in accordance with one embodiment of the present disclosure. For example, FIG. 5B may be a plan view of a layout of the DQ circuit 60, the pad 54, a via 1 55*a* and a via 2 55*b* in the semiconductor device 10, from a third direction (not shown) that is perpendicular to the first and second directions, 57*a* and 57*b*. For example, the DQ circuit 60 may be the DQ circuit 60 in FIG. 5A. For example, the read data storage circuit (RDSC) 61 and the write data driver circuit (WDDC) 64 may be disposed under the pad 54 coupled to one of the plurality of DQ circuits 60, the DQS circuit 60' and the DM circuit 60" in FIG. 4. For example, the one of the plurality of DQ circuits 60, the DQS circuit 60' and the DM circuit 60" may be disposed across the pad formation area 51 and the peripheral circuit area 52. The write data driver circuit (WDDC) 64 and at least a portion of the read data storage circuit (RDSC) 61 may be formed in the pad formation area 51.

For example, the read clock synchronization circuit (RCSC) 62 may be disposed next to the read data storage circuit (RDSC) 61 located in the first direction 57*a*. The driver circuit (DC) 63 may be disposed next to the read clock synchronization circuit (RCSC) 62 located in the first direction 57*a*. The output buffer (OB) 68 may be disposed between the driver circuit (DC) 63 in the first direction 57*a* and the output ESD protection circuit (OEP) 68' that is below the via 1 55a. Thus, circuit components of the read data path 60a, including the read data storage circuit (RDSC) 61, the read clock synchronization circuit (RCSC) 62, the driver circuit (DC) 63, the output buffer (OB) 68 and the output ESD protection circuit (OEP) 68', may be disposed in an area between the pad 54 and the via 1 55a as viewed from the third direction.

For example, the write clock synchronization circuit (WCSC) 65 may be disposed next to the read data storage circuit (RDSC) 61 located in the first direction 57a. The timing adjustment circuit (TAC) 66 may be disposed next to the write clock synchronization circuit (WCSC) 65 located in the first direction 57a. The input buffer (IB) 67 may be disposed between the timing adjustment circuit (TAC) 66 in the first direction 57a and the input ESD protection circuit (IEP) 67' that is located in the first direction 57a of a VDDQ/VSS ESD protection circuit (VVEP) 69 below the via 2 55b that may protect a voltage signal from the via 2 55b, having power supply potential, either VDDQ or VSS, from failures due to electrostatic charges. For example, the via 1 55a may be located in the second direction 57b from the via 2 55b and the output ESD protection circuit (OEP) 68' may be located in the second direction 57b from the VDDQ/VSS ESD protection circuit (VVEP) 69. Thus, circuit components of the write data path 60b, including the write data driver circuit (WDDC) 64, the write clock synchronization circuit (WCSC) 65, the timing adjustment circuit (TAC) 63, the input buffer (IB) 67 and the input ESD protection circuit (IEP) 67', may be disposed in an area between the pad 54 and the via 2 55b as viewed from the third direction.

Figure 6:
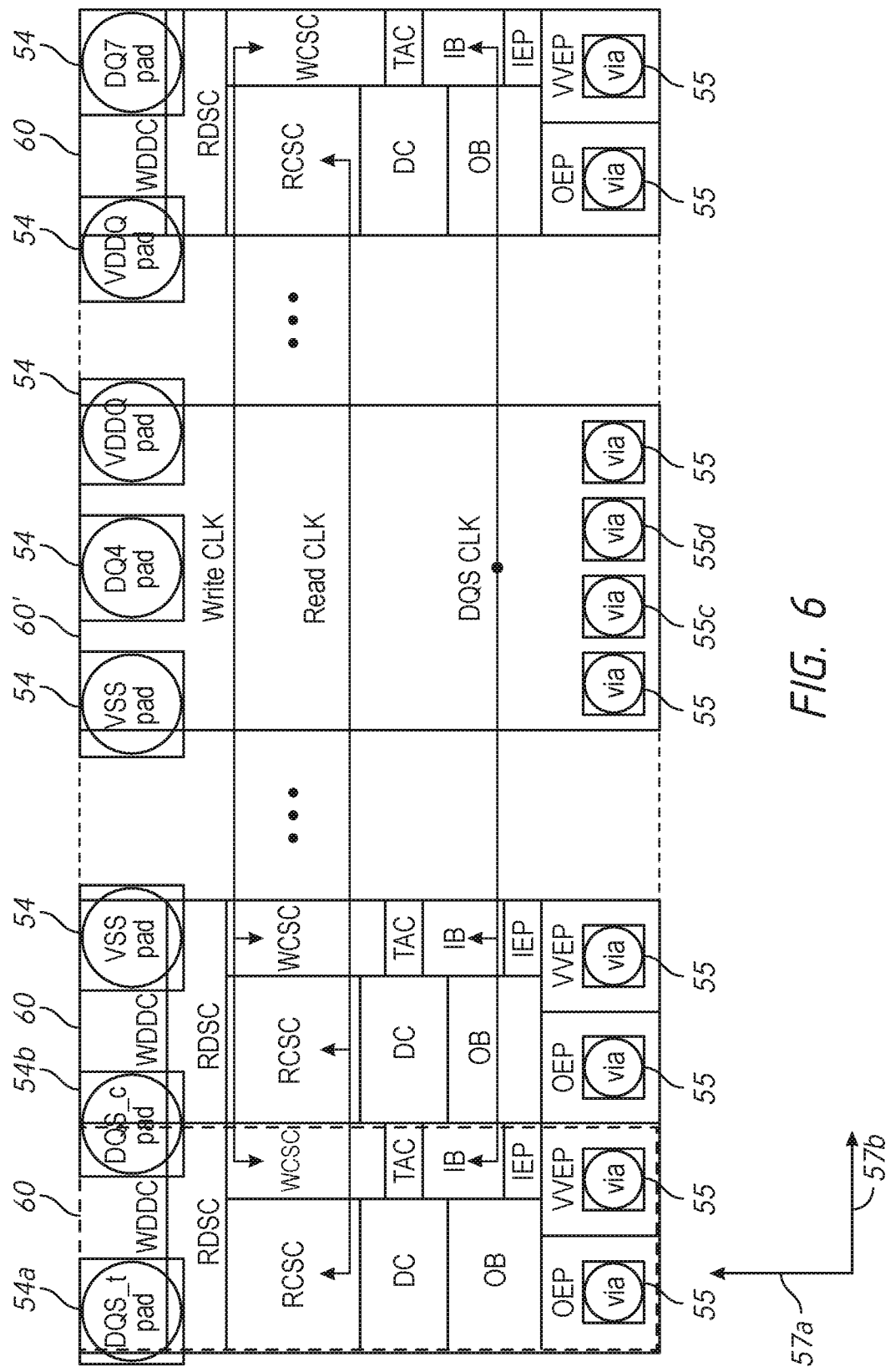
FIG. 6 is a layout diagram including a plurality of DQ circuits, a DQS circuit and a plurality of pads above the plurality of DQ circuits and the DQS circuit in the semiconductor device in accordance with one embodiment of the present disclosure.

FIG. 6 is a layout diagram including a plurality of DQ circuits 60, a DQS circuit 60' and a plurality of pads 54 above the plurality of DQ circuits 60 and the DQS circuit 60' in the semiconductor device 10 in accordance with one embodiment of the present disclosure. For example, FIG. 6 may be a plan view of a plurality of pads 54 above the plurality of DQ circuits 60 and the DQS circuit 60' in the semiconductor device 10 from the third direction (not shown). The plurality of pads 54 may include the DQS_t pad 54a and the DQS_c pad 54b that may be located above the read data storage circuit (RDSC) and the write data driver circuit (WDDC) of the DQ circuit 60 for DQ0. The plurality of pads 54 may include the DQS_c pad and the VSS pad that may be located above the read data storage circuit (RDSC) and the write data driver circuit (WDDC) of the DQ circuit 60 for DQ1. The plurality of pads 54 may include the VSS pad, the DQ4 pad and the VDDQ pad that may be located above the DQS circuit 60'. The plurality of pads 54 may include the VDDQ pad and the DQ7 pad that may be located above the read data storage circuit (RDSC) and the write data driver circuit (WDDC) of the DQ circuit 60 for DQ7. As previously shown in FIG. 4, the DQS_t pad 54a above the DQ circuit 60 for DQ0 may be coupled to a via 55c in the DQS circuit 60', and the DQS_c pad 54b above the DQ circuits 60 for DQ0 and DQ1 may be coupled to a via 55c in the DQS circuit 60'. A write clock line (Write CLK) may be coupled to the write clock synchronization circuits (WCSCs) in the DQ circuits 60 to provide the clock signal for writing operations (Write CLK). A read clock line (Read UK) may be coupled to the read clock synchronization circuits (RCSCs) in the DQ circuits 60 to provide the clock signal for reading operations (Read CLK). The data strobe clock signal (DQS CLK) may be provided from the DQS circuit 60' via a data strobe clock line (DQS CLK) to the input buffers (Ms) across in the DQ circuits 60.

The DQ circuit 60 may be located between a pad and a via in the DQ circuit 50, as viewed from the third direction, where the pad may be coupled to a DQ circuit 60 that is not below the pad. In the other word, the pad coupled to the DQ circuit 60 may be located outside of the DQ circuit 60, as viewed from the third direction.

Figure 7:
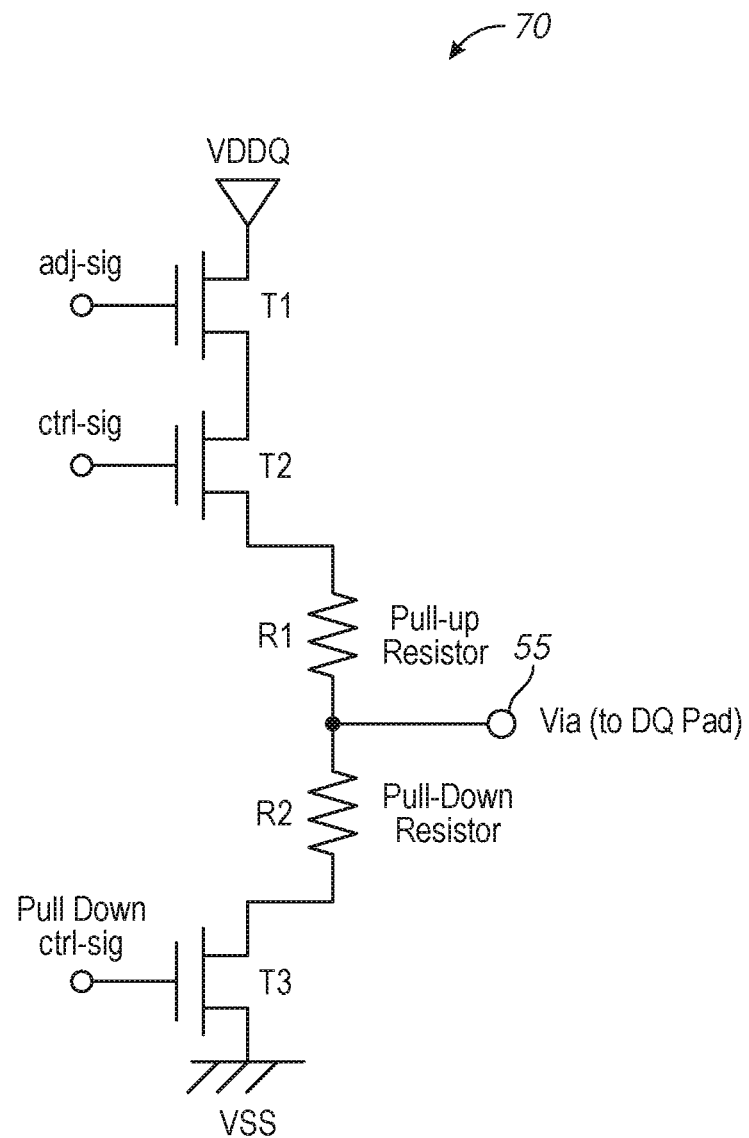
FIG. 7 is a circuit diagram of a unit circuit in the output buffer in the DQ circuit in the semiconductor device in accordance with the present disclosure.

FIG. 7 is a circuit diagram of a unit circuit 70 in the output buffer 68 in the DQ circuit 60 in the semiconductor device 10 in accordance with the present disclosure. For example, the output buffer 68 in FIGS. 5A and 5B may include a plurality of unit circuits 70 (not shown). Each unit circuit 70 may include a plurality of transistor circuits, in order to represent a desired output impedance based on ZQ calibration and a desired through-rate based on through-rate calibration, as adjusted by the driver circuit (DC) 63. For example, the unit circuit 70 of the output buffer 68 may include a transistor T1 that receives an adjustment signal (adj-sig), a transistor T2 that receives a control signal (ctrl-sig), a pull-up resistor R1, a pull-down resistor R2, and a transistor T3 that receives a pull-down control signal (PullDown ctrl-sig), series-coupled in order between power supply potentials VDDQ and VSS. For example, one the transistors T1, T2 and T3 may be an N-channel type. A node coupling the pull-up resistor R1 and the pull-down resistor R2 may be coupled to a via 55 that may be further coupled to a pad 54 for DQ (e.g., DQ0, DQ1, . . . DQ7) where data is read out.

Figure 8:
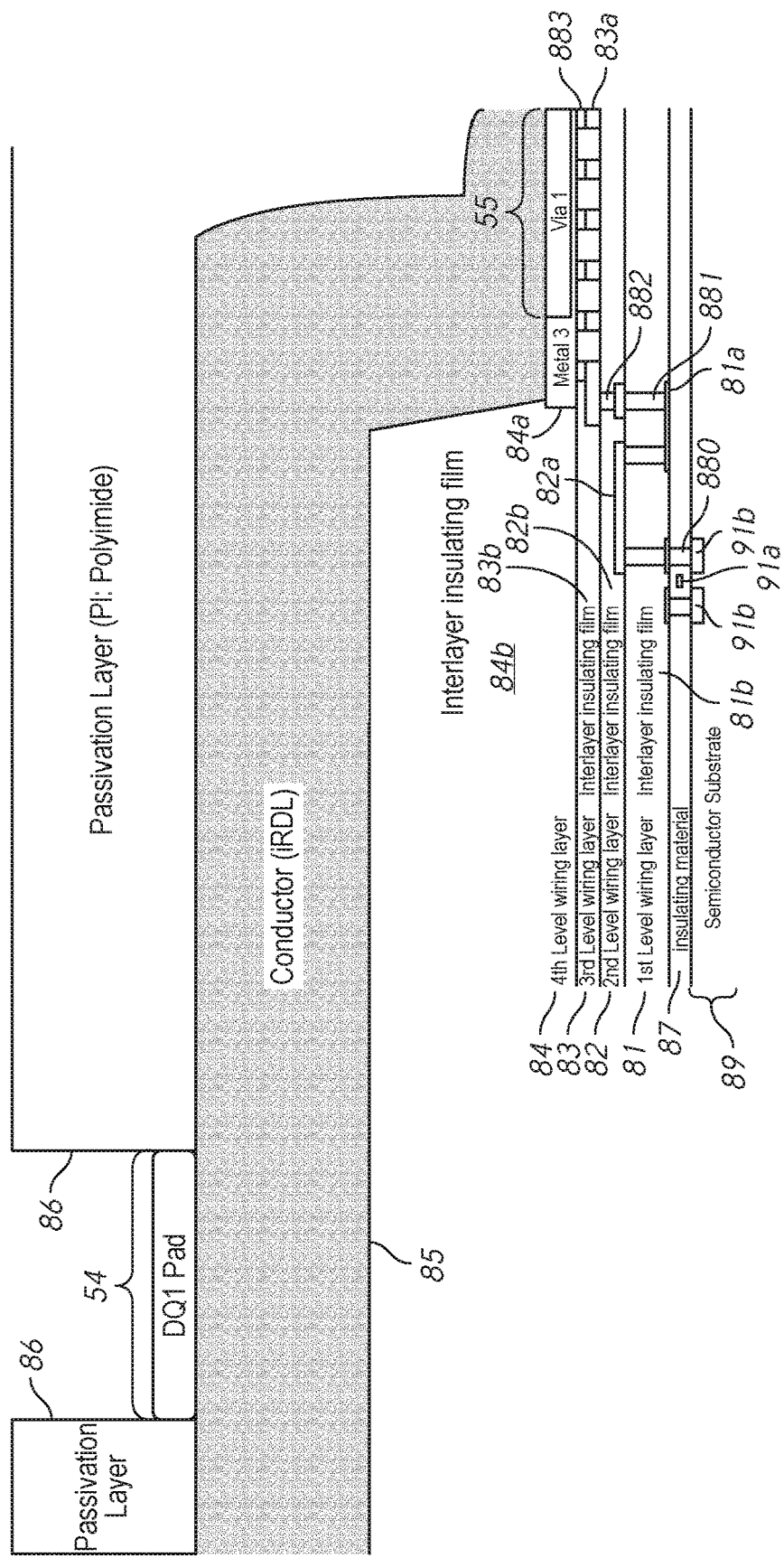
FIG. 8 is a schematic diagram of circuits around external terminals in the semiconductor device in accordance with the present disclosure.

FIG. 8 is a schematic diagram of circuits around external terminals in the semiconductor device in accordance with the present disclosure. For example, FIG. 8 may be a sectional view of circuits around external terminals in the semiconductor 10 along the cross section 100 in FIG. 4. The semiconductor 10 may include a semiconductor substrate 89, insulating material 87 that insulates the semiconductor substrate 89 and a plurality of wiring layers in a multi-level wiring structure, including first to fourth level wiring layers 81 to 84, a conductor 85 and a passivation layer 86. Each layer of the first to fourth level wiring layers 81 to 84 may include a metal layer to form a conductive wirings and an interlayer insulating film as an insulator to isolate the metal layer from metal layers of other wiring layers. A circuit component in the metal layer and another component in the metal layer of another wiring layer may be coupled by a contact plug and/or conductive via. The DQ circuit 60, the DQS circuit 60' and the DM circuit 60' may be provided through the first to fourth level wiring layers 81 to 84.

Table 1 shows examples of materials and thicknesses of wiring layers.

TABLE 1

| Level of wiring layer | Material | Thickness (um) |
| --- | --- | --- |
| 1$^{st}$ level wiring layer | Metal 0: Tungsten | 0.02 |
| 2$^{nd}$ level wiring layer | Metal 1: Copper | 0.2 |
| 3$^{rd}$ level wiring layer | Metal 2: Copper | 0.3 |
| 4$^{th}$ level wiring layer | Metal 3: Aluminum | 0.7 |

For example, a gate 91a of a transistor in the DQ circuit 60 may be disposed in the insulating material 87, and source/drain diffusions (a source or drain region) 91b of the transistors may be disposed in the semiconductor substrate 89. One of the source/drain diffusions 91b may be coupled to a circuit component made of a high conductivity metal layer (Metal 1, of a high conductivity material, such as Copper) 82a in the second level wiring layer 82 via a contact plug 880, a component of a low conductivity metal layer (Metal 0, of a low conductivity material, such as Tungsten)

81a and a conductive plug 881. The circuit component in the metal layer (Metal 1) 82a may be coupled to a conductor made of the metal layer (Metal 0) 81a. The metal layer (Metal 0) 81a is typically very thin with high impedance, such as Tungsten, that is disposed in the first level wiring layer 81 via another contact plug 881. The conductor may be, for example, the pull-up resistor R1 or the pull-down resistor R2. A first interlayer insulating film 81b may cover the conductor made of the metal layer (Metal 0) 81a, including the pull-up resistor R1 or the pull-down resistor R2. The resistor may be coupled to another conductor made of the metal layer (Metal 1) 82a in the second level wiring layer 82. A second interlayer insulating film 82b may cover the other conductor made of the metal layer (Metal 1) 82a. The other conductor made of the metal layer (Metal 1) 82a may be coupled to a circuit component made of a high conductivity metal layer (Metal 2, of a high conductivity material, such as Copper) 83a in the third level wiring layer 83 by a conductive via 882. A third interlayer insulating film 83b may cover the circuit component made of the metal layer (Metal 2) 83a. The circuit component may be coupled to a via 1 55 made of a middle conductivity metal layer (Metal 3, of a middle conductivity material, such as aluminum) 84a in the fourth level wiring layer 84. A fourth interlayer insulating film 84b may cover the via 1 55 made of the metal layer (Metal 3) 84a. In this manner, the source or drain region 91b of the transistor in the DQ circuit 60 in the semiconductor substrate 89 may be coupled to a via 1 55 in the fourth level wiring layer 84 through the first to fourth level wiring layers 81 to 84 via contact plugs 880 and 881 and a contact via 882. Similarly, vias 55 in the DQ circuits 60 and DQS circuit 61, made of the metal layer (Metal 3) 84a in the fourth level wiring layer 84, may be coupled to transistors in the semiconductor substrate 89 via conduct plugs and conductive vias.

The fourth level wiring layer 84 may include the fourth interlayer insulating film 84b, typically very thick, covering the metal layer (Metal 3) 84a. The fourth interlayer insulating film 84b may have a hole and the via 1 55 made of the metal layer (Metal 3) 84a may be in contact with a conductor 85 at the hole. The conductor 85 may be made of a distribution conductive layer (e.g., an inline redistribution layer [iRDL]) that is formed on the interlayer insulating film at the fourth level wiring layer. For example, the distribution conductive layer may be made of a mid-level conductive material, such as aluminum with a thickness of approximately 4.5 µm. For example, the conductor 85 may have a width of approximately 8 µm in order to reduce impedance of the conductor 85. A DQ pad 54, (e.g., the DQ1 pad 54) may be disposed on the conductor 85, surrounded by a passivation layer 86 made of polyimide (PI). Thus, the impedance of the longest conductor 85, such as a wiring 56 between the DQ0 pad 54 as in FIG. 4 and the via 55 of the DQ circuit 60 for DQ0 may be reduced, and the impedance of the shortest conductor 85, such as a wiring 56 between the DQ7 pad 54 the via 55 of the DQ circuit 60 for DQ7 may be further reduced. Thus, a difference in impedance of the read data paths 60a or the write data paths 60b (as shown in FIG. 5A) for DQ0 to DQ7 may be reduced within an acceptable range.

While the impedance of the conductor 85 is dependent on the thickness, the width, and/or the material, it may be possible to control the thickness of the conductor 85, rather than the width of the conductor 85, when the metal layer (Metal 3) 84a and the conductor 85 may be formed to be in proximity to each other. For example, the thickness of the conductor 85 may be a plurality of times, (e.g. at least 5 times) or more than the metal layer (Metal 3) 84a. Since the conductor 85 may be formed with an increased thickness as discussed above, it may be desirable to form the conductors 85 of the distribution conductive layer using a manufacturing machine that is dedicated to the iRDL forming process independently from a machine for a process forming the plurality of wiring layers including first to fourth level wiring layers 81 to 84.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising a semiconductor chip, wherein the semiconductor chip comprises:
    an edge defining a termination of the semiconductor chip;
    a pad formation area along the edge, the pad formation area comprising a plurality of pads arranged along the edge;
    a via coupled to a corresponding one of the plurality of pads; and
    a distribution conductor coupled between the via and the corresponding pad.

2. The apparatus of claim 1, wherein the semiconductor chip further comprises one or more conductors in each of a first-level wiring layer and a second-level wiring layer.

3. The apparatus of claim 2, wherein a distribution conductive layer of the distribution conductor is greater in thickness than each of any of the one or more conductors.

4. The apparatus of claim 2, wherein a distribution conductive layer of the distribution conductor is at least five times as thick as each of any of the one or more conductors.

5. The apparatus of claim 1, wherein the semiconductor chip further comprises a circuit block, and the circuit block comprises a first circuit and a transistor arranged between the first circuit and the via.

6. The apparatus of claim 5, wherein the circuit block further comprises a second circuit associated with the first circuit and disposed in the pad formation area under at least one of the plurality of pads.

7. The apparatus of claim 1, wherein the semiconductor chip further comprises at least a first-level wiring layer and a second-level wiring layer, the first-level wiring layer includes one or more first conductors and a first interlayer insulating film covering the one or more first conductors, and the second-level wiring layer includes one or more second conductors and a second interlayer insulating film covering the one or more second conductors.

8. The apparatus of claim 1, wherein the semiconductor chip further comprises a circuit block comprising a first circuit, and
    wherein the via is disposed along a first side of the first circuit that is opposite to a second side of the first circuit, and the pad formation area extends along the second side of the first circuit.

9. The apparatus of claim 1, wherein the semiconductor chip further comprises:
a first-level wiring layer comprising a first metal layer; and
a second-level wiring layer between the first-level wiring layer and a distribution conductive layer of the distribution conductor, and
wherein the second-level wiring layer comprises a second metal layer.

10. The apparatus of claim 9; wherein the first metal layer is made of a low conductivity material and the second metal layer is made of a middle conductivity material.

11. A semiconductor chip, comprising:
a data queue (DQ) circuit comprising a via made of a metal layer;
a distribution conductive layer having a portion disposed on the metal layer; and
a pad disposed on a portion of the distribution conductive layer and in a pad formation area, the pad formation area positioned on an opposite side of the DQ circuit from the via.

12. The semiconductor chip of claim 11, wherein the DQ circuit comprises a first circuit, and
wherein the via is disposed along a first side of the first circuit that is opposite to a second side of the first circuit, and the pad formation area extends along the second side of the first circuit.

13. The semiconductor chip of claim 12, wherein the DQ circuit further comprises a second circuit associated with the first circuit and disposed in the pad formation area.

14. The semiconductor chip of claim 11, further comprising:
first, second, third, and fourth-level wiring layers each comprising a corresponding metal layer and a corresponding interlayer insulating film.

15. The semiconductor chip of claim 11, further comprising:
a first-level wiring layer and a second-level wiring layer each comprising one or more conductors.

16. The semiconductor chip of claim 15, wherein the distribution conductive layer is at least five times as thick as each of any of the one or more conductors.

17. An apparatus comprising:
a pad formation area comprising a plurality of pads;
a peripheral circuit area comprising a via disposed at a side opposite to the pad formation area; and
a plurality of conductors comprising a conductor coupling the via to a corresponding one the plurality of pads, the conductor crossing over, at least in part, an area in the peripheral circuit area between the via and the corresponding pad.

18. The apparatus of claim 17, further comprising:
first and second-level wiring layers each comprising one or more conductors,
wherein a conductive layer of the conductor coupling the via to the corresponding pad is at least five times as thick as each of any of the one or more conductors.

19. The apparatus of claim 18, further comprising:
a semiconductor substrate that is at an opposite side to the second-level wiring layer with respect to the first-level wiring layer,
wherein the first and second-level wiring layers comprise first and second metal layers, respectively, and
wherein the via is made of the second metal layer.

20. The apparatus of claim 17, further comprising:
a semiconductor substrate; and
a first circuit comprising at least one transistor made, at least in part, of the semiconductor substrate,
wherein the via is disposed along a first side of the first circuit.

* * * * *